(12) United States Patent
Kim et al.

(10) Patent No.: US 9,673,275 B2
(45) Date of Patent: Jun. 6, 2017

(54) ISOLATED COMPLEMENTARY METAL-OXIDE SEMICONDUCTOR (CMOS) DEVICES FOR RADIO-FREQUENCY (RF) CIRCUITS

(71) Applicant: QUALCOMM Incorporated, San Diego, CA (US)

(72) Inventors: Daeik Daniel Kim, Del Mar, CA (US); Changhan Hobie Yun, San Diego, CA (US); Je-Hsiung Jeffrey Lan, San Diego, CA (US); Niranjan Sunil Mudakatte, San Diego, CA (US); Jonghae Kim, San Diego, CA (US); Matthew Michael Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/920,851

(22) Filed: Oct. 22, 2015

(65) Prior Publication Data

US 2017/0117358 A1    Apr. 27, 2017

(51) Int. Cl.
*H01L 29/06*    (2006.01)
*H01L 29/78*    (2006.01)
(Continued)

(52) U.S. Cl.
CPC ........ *H01L 29/0653* (2013.01); *H01L 21/762* (2013.01); *H01L 21/76898* (2013.01);
(Continued)

(58) Field of Classification Search
CPC .... H01L 29/0653; H01L 29/78; H01L 23/481
See application file for complete search history.

(56) References Cited

U.S. PATENT DOCUMENTS 5,841,197 A    11/1998 Adamic, Jr.
6,486,929 B1 *  11/2002 Vu ........................ A61B 3/113
257/347
(Continued)

FOREIGN PATENT DOCUMENTS

WO    2013019499 A2    2/2013

OTHER PUBLICATIONS

Invitation to Pay Additional Fees and Parital International Search Report for PCT/US2016/058072, mailed Jan. 13, 2017, 7 pages.
(Continued)

*Primary Examiner* — Ida M Soward
(74) *Attorney, Agent, or Firm* — Withrow & Terranova, PLLC

(57) ABSTRACT

Isolated complementary metal-oxide semiconductor (CMOS) devices for radio-frequency (RF) circuits are disclosed. In some aspects, an RF circuit includes CMOS devices, a silicon substrate having doped regions that define the CMOS devices, and a trench through the silicon substrate. The trench through the silicon substrate forms a continuous channel around the doped regions of one of the CMOS devices to electrically isolate the CMOS device from other CMOS devices embodied on the silicon substrate. By so doing, performance characteristics of the CMOS device, such as linearity and signal isolation, may be improved over those of conventional CMOS devices (e.g., bulk CMOS).

18 Claims, 11 Drawing Sheets

(51) Int. Cl.

| | | |
|---|---|---|
| *H01L 23/48* | (2006.01) | |
| *H01L 21/762* | (2006.01) | |
| *H01L 21/768* | (2006.01) | |
| *H01L 21/78* | (2006.01) | |

(52) U.S. Cl.
CPC ............ *H01L 21/78* (2013.01); *H01L 23/481* (2013.01); *H01L 29/78* (2013.01)

(56) References Cited

U.S. PATENT DOCUMENTS

| | | | |
|---|---|---|---|
| 7,285,477 B1 | 10/2007 | Bernstein et al. | |
| 7,851,923 B2 | 12/2010 | Erturk et al. | |
| 7,968,409 B2* | 6/2011 | Seliskar | H01L 21/82348 257/E21.19 |
| 8,212,297 B1* | 7/2012 | Law | H01L 27/14618 257/292 |
| 8,278,731 B2* | 10/2012 | Sumitomo | H01L 21/76243 257/350 |
| 8,673,775 B2* | 3/2014 | Chiou | H01L 21/76898 257/774 |
| 8,779,559 B2 | 7/2014 | Ramachandran et al. | |
| 9,136,153 B2* | 9/2015 | Or-Bach | H01L 21/6835 |
| 9,337,235 B2* | 5/2016 | Chen | H01L 31/18 |
| 9,564,420 B2* | 2/2017 | Yu | H01L 23/3128 |
| 9,564,432 B2* | 2/2017 | Or-Bach | H03K 17/687 |
| 2003/0107061 A1 | 6/2003 | Ootera | |
| 2004/0021198 A1 | 2/2004 | Wong | |
| 2005/0230763 A1* | 10/2005 | Huang | H01L 21/82384 257/374 |
| 2006/0177173 A1* | 8/2006 | Shastri | G02B 6/42 385/14 |
| 2009/0315119 A1 | 12/2009 | Stribley et al. | |
| 2011/0266691 A1* | 11/2011 | Lin | H01L 21/76816 257/774 |
| 2012/0132993 A1* | 5/2012 | Pinguet | H01L 21/84 257/351 |
| 2013/0115730 A1* | 5/2013 | El-Gamal | B81C 1/00301 438/51 |
| 2013/0264676 A1 | 10/2013 | Yang et al. | |
| 2014/0008757 A1 | 1/2014 | Ramachandran et al. | |
| 2014/0009205 A1 | 1/2014 | Madan et al. | |
| 2014/0054743 A1 | 2/2014 | Hurwitz et al. | |
| 2014/0367777 A1 | 12/2014 | Huang et al. | |
| 2015/0303095 A1* | 10/2015 | Kirby | H01L 21/743 438/301 |
| 2016/0095221 A1* | 3/2016 | Ramachandran | H05K 1/115 361/783 |
| 2016/0145095 A1* | 5/2016 | Tsai | B81B 7/0074 257/415 |
| 2016/0204158 A1* | 7/2016 | Hsu | H01L 27/14643 257/459 |
| 2016/0218090 A1* | 7/2016 | Yu | H01L 23/5226 |
| 2017/0025398 A1* | 1/2017 | Beyer | H01L 25/167 |

OTHER PUBLICATIONS

International Search Report and Written Opinion for PCT/US2016/058072, mailed Feb. 27, 2017, 25 pages.

* cited by examiner

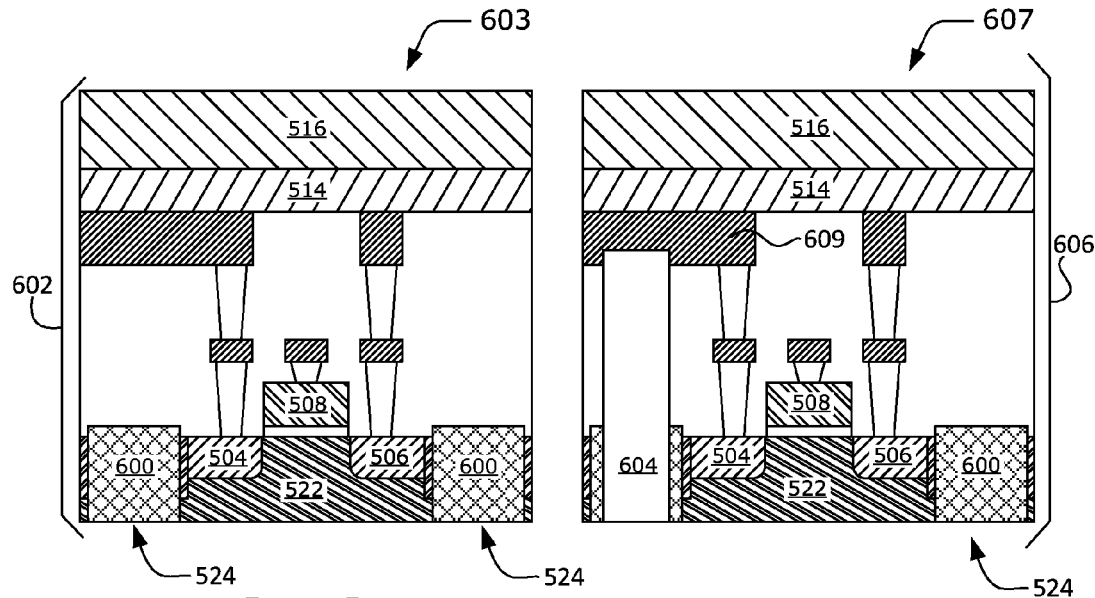
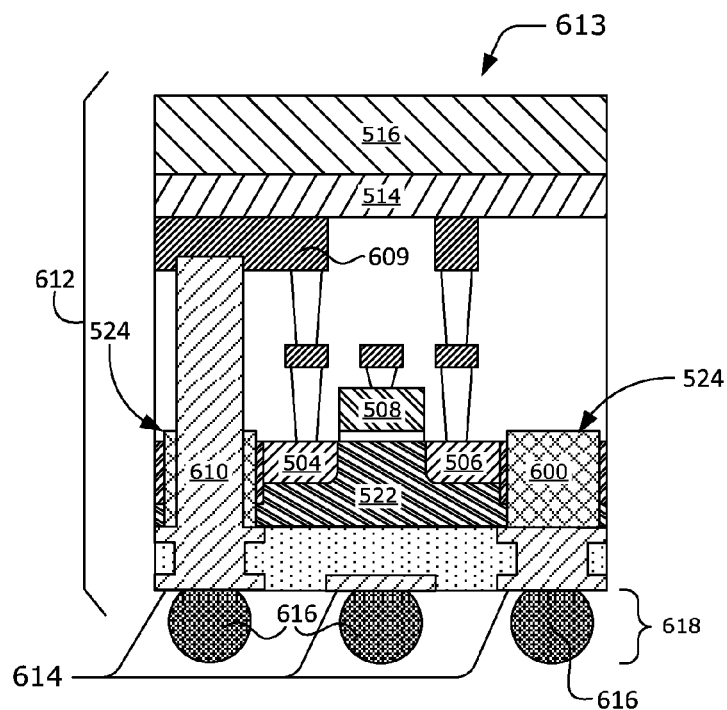

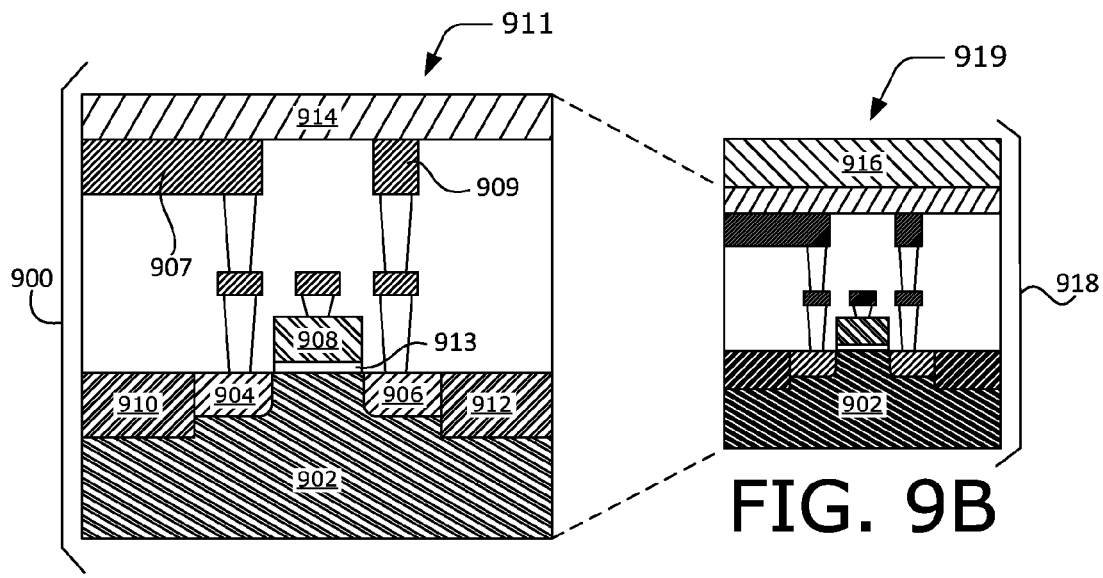
FIG. 9A
FIG. 9B
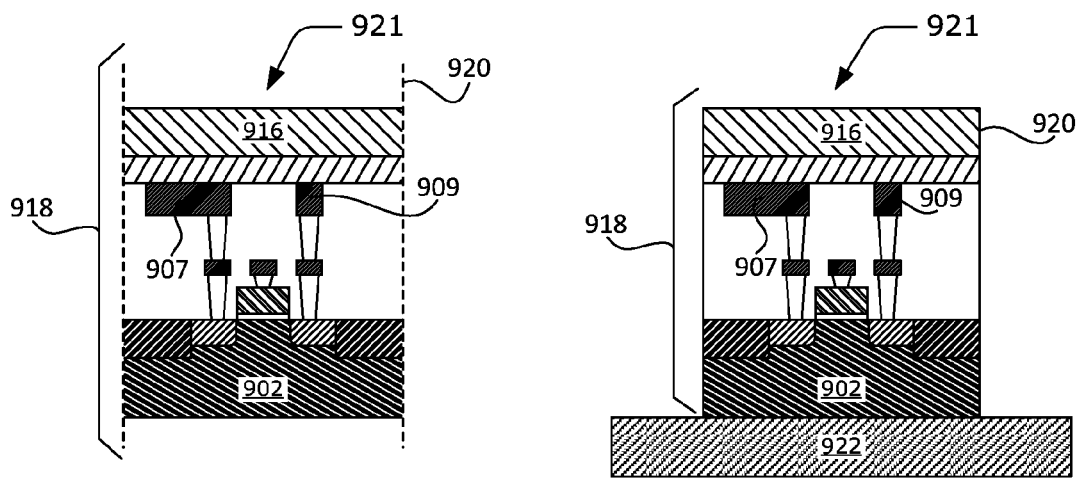
FIG. 9C
FIG. 9D

ISOLATED COMPLEMENTARY METAL-OXIDE SEMICONDUCTOR (CMOS) DEVICES FOR RADIO-FREQUENCY (RF) CIRCUITS

BACKGROUND

I. Field of the Disclosure

This disclosure relates generally to complementary metal-oxide semiconductor (CMOS) devices, and more specifically, to implementing CMOS devices for radio-frequency (RF) applications and circuits.

II. Background

Many electronic devices include a modem that enables communication of data via a wireless network. As users and applications of devices consume increasing amounts of data through wireless networks, network providers and equipment manufacturers have strived to increase data rates to improve end user experience. Conventional methods for increasing data rates of devices include increasing transmit power or size of a communication carrier that is available to a device for communication via a wireless network.

Due to government regulations and/or industry standards, however, increasing transmit power and carrier bandwidth are no longer viable options to increase data rates. Transmission power limits are typically restricted due to safety and interference concerns, and saturation of the wireless spectrum has fragmented or reduced available carriers. As such, some wireless providers implement carrier aggregation schemes in which multiple carriers, such as three (3) or five (5) different carriers, are combined to provide a larger aggregate carrier or "pipe" to support desired data rates.

To implement device-side carrier aggregation, the device's modem communicates over adjacent carriers, non-adjacent carriers, or carriers in different frequency bands. Thus, to facilitate carrier aggregation, radio-frequency (RF) hardware of a device's modem needs to support communication over many different combinations of carriers and frequency bands. Conventionally, switches and multiplexers have been added to the RF hardware of the modem to enable signal routing for this multi-carrier and/or multi-band communication. The added switches and multiplexers, however, often suffer from non-linearity or poor isolation, which results in signal attenuation or interference.

SUMMARY OF THE DISCLOSURE

In some aspects, a radio-frequency (RF) circuit is provided. The RF circuit comprises a plurality complementary metal-oxide semiconductor (CMOS) devices. The RF circuit also comprises a substrate (e.g., silicon substrate) having doped regions that define the plurality of CMOS devices. The RF circuit also comprises a trench through the substrate. The trench through the substrate forms a continuous channel around the doped regions of a CMOS device among the plurality of CMOS devices to electrically isolate the CMOS device from at least one other CMOS device among the plurality of CMOS devices embodied on the substrate.

In other aspects, a method for isolating a CMOS device is provided. The method comprises adding a top-molding layer to a CMOS wafer having a silicon substrate on which a plurality of CMOS devices are embodied. The method also comprises forming, while supporting the CMOS wafer via the top-molding layer, a trench through the silicon substrate and around a CMOS device among the plurality of CMOS devices. The method also comprises filling the trench around the CMOS device with an insulator to isolate the CMOS device from other CMOS devices among the plurality of CMOS devices to provide an isolated CMOS device suitable for use in RF circuits.

In yet other aspects, an RF circuit is provided. The RF circuit comprises a silicon substrate. The RF circuit also comprises a plurality of CMOS devices embodied on the silicon substrate. The RF circuit also comprises means for electrically isolating a portion of the silicon substrate on which a CMOS device among the plurality of CMOS devices is embodied from another portion of the silicon substrate on which at least one other CMOS device among the plurality of CMOS devices is embodied.

In other aspects, an RF semiconductor component is provided. The RF semiconductor component comprises a plurality of CMOS devices embodied on a silicon substrate with at least one CMOS device among the plurality of CMOS devices being embodied on a portion of the silicon substrate that is separated from a remaining portion of the silicon substrate by a trench through the substrate and around the at least one CMOS device. The RF semiconductor component also comprises a metallic interconnect layer that enables connectivity to the plurality CMOS devices. The RF semiconductor component also comprises a casing that encapsulates the plurality CMOS devices and supports the metallic interconnect layer.

BRIEF DESCRIPTION OF THE FIGURES

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

FIGS. 6A-6C illustrate additional cross-sections of the CMOS wafer in FIGS. 5A-5D in which the isolated CMOS device is implemented;

FIG. 9A-9D illustrate cross-sections of an example CMOS wafer in which an isolated CMOS device is implemented;

DETAILED DESCRIPTION

Figure 1:
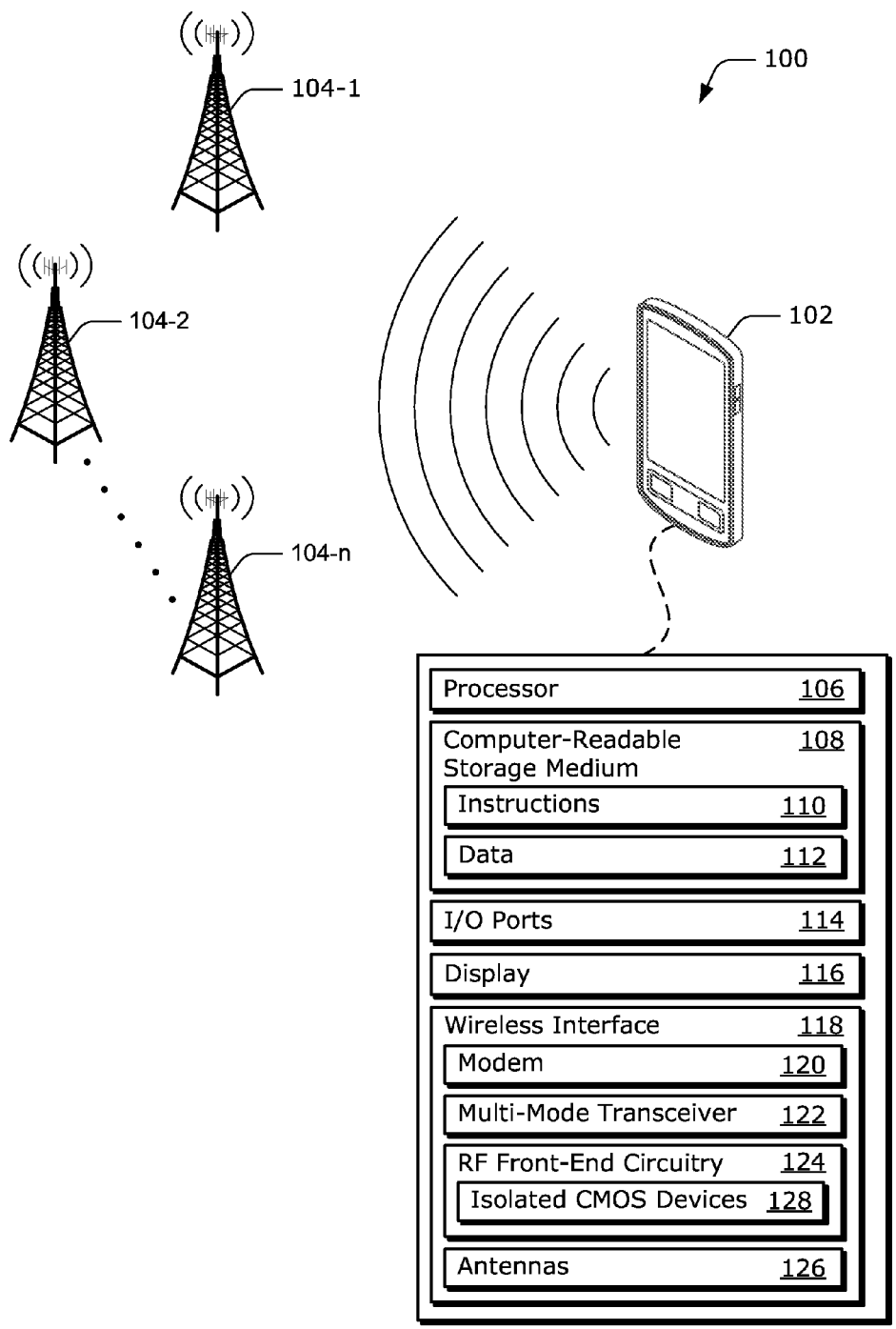
FIG. 1 illustrates an example environment that includes a computing device and wireless network.

Modems include radio-frequency (RF) circuitry (e.g., front-end circuitry) that enables communication over various combinations of carriers and frequency bands. In the past, this circuitry included a small number of RF switches to control transmission or reception of signals over a selected frequency band. In order to increase data rates, however, many wireless network providers implement multiple-input multiple-output (MIMO) and carrier aggregation technology. These technologies enable higher data rates by concurrently communicating over multiple carriers, frequency bands, and antennas, which greatly increases a number of carrier, frequency, and/or antenna combinations by which the modem communicates.

To support these possible combinations of carriers, frequencies, and antennas, RF switches and multiplexers are often added to the RF front-end circuitry to enable selection of a communication mode, power mode, frequency band, filtering, diversity, antennas, and so on. The addition of these devices also increases complexity of the RF front-end circuitry, which results in RF signals being routed through multiple RF switches or multiplexers prior to transmission or after reception. Because RF switches often suffer from non-linearity and poor isolation, the transmitted RF signals may be attenuated or interfere with relatively low-power received signals.

In an attempt to address issues related to linearity and isolation, some RF component manufacturers have moved away from implementing RF devices on conventional silicon substrates and moved toward more unconventional materials. For example, some manufacturers implement RF devices on hybrid substrates, such as silicon-on-insulator (SOI, e.g., buried oxide), silicon-on-sapphire, or high-resistivity (e.g., trap rich silicon) substrates, which offer improved linearity over conventional bulk silicon substrates. These hybrid substrates have drawbacks, however, as they are much more expensive than conventional silicon and susceptible to capacitive modulation due to junctions between layers of silicon, insulators, or other materials.

This disclosure describes aspects of isolated complementary metal-oxide semiconductor (CMOS) devices for RF circuits. The techniques and circuits described herein enable isolated CMOS devices, which can be implemented using bulk CMOS wafers as an example, to provide isolated CMOS devices that are suitable for RF applications. By isolating the CMOS devices, issues associated with conventional CMOS substrates, such as poor active performance and substrate coupling as examples, can be mitigated or eliminated. Additionally, the isolated CMOS devices can be implemented cost effectively, such as without altering a front end-of-line (FEOL) process of bulk CMOS wafers and by using simple or low-cost package processing to isolate the CMOS devices.

In this regard, in some aspects of isolated CMOS devices, a top-molding layer is added to a CMOS wafer having a silicon substrate on which the CMOS devices are embodied. A trench is then formed, while supporting the CMOS wafer via the top-molding layer, through the silicon substrate and around one of the CMOS devices. The trench around the CMOS device is then filled with an insulator to isolate the CMOS device from other CMOS devices to provide an isolated CMOS device. In at least some cases, the isolated CMOS device has better linearity and isolation characteristics than conventional CMOS or SOI devices at RF frequencies, making the isolated CMOS device suitable for use in RF circuits as an example.

These and other aspects of isolated CMOS devices for RF circuits are described below in the context of an example environment, example RF component, and techniques. Any reference made with respect to the example environment or component, or elements thereof, is by way of example only and is not intended to limit any of the aspects described herein.

Example Environment

FIG. 1 illustrates an example environment 100, which includes computing device 102. In this example, computing device 102 is implemented as a smart-phone. Although not shown, computing device 102 may be implemented as any suitable computing or electronic device, such as a modem, cellular base station, broadband router, access point, cellular phone, gaming device, navigation device, media device, laptop computer, cellular test equipment, desktop computer, server, network-attached storage (NAS) device, smart appliance, vehicle-based communication system, and the like. Computing device 102 communicates data via cell towers 104-1, 104-2, and/or 104-n, which may be configured to provide a wireless network. Although shown as three (3) cell towers, cell towers 104-1-104-n may represent any suitable number of cell towers, where n equals any suitable integer.

Cell towers 104-1-104-n may communicate with computing device 102 by transferring a communication link between computing device 102 and cell towers 104-1-104-n, from one of the cell towers 104-1-104-n to another, commonly referred to as "handoff" of the communication link. In some aspects, other devices, such as a satellite, access point, peer-to-peer device, mesh network node, or fiber-optic line, may provide an intermediate or alternate communication link for computing device 102 and/or cell towers 104-1-104-n. Therefore, computing device 102 may communicate with cell towers 104-1-104-n, or another device, via a wired connection, wireless connection, or a combination thereof.

Computing device 102 includes processor 106 and a computer-readable storage medium 108. Processor 106 may include any type of processor, such as an application processor or multi-core processor, configured to execute processor-executable code stored by computer-readable storage medium 108. Computer-readable storage medium 108 (CRM 108) may include any suitable type of data storage media, such as volatile memory (e.g., random access memory (RAM)), non-volatile memory (e.g., Flash memory), optical media, magnetic media (e.g., disk or tape), and the like. In the context of this disclosure, CRM 108 is implemented to store instructions 110 and data 112 of computing device 102, and thus does not include transitory propagating signals or carrier waves.

Computing device 102 also includes input/output ports 114 (I/O ports 114), display 116, and wireless interface 118. I/O ports 114 enable data exchanges or interaction with other devices, networks, or users. I/O ports 114 may include serial ports (e.g., universal serial bus (USB) ports), parallel ports, audio ports, infrared (IR) ports, and the like. Display 116 presents graphics of computing device 102, such as a user interface associated with an operating system, program, or application.

Wireless interface 118 provides connectivity to respective networks and other electronic devices connected therewith. Alternately or additionally, computing device 102 may include a wired data interface, such as Ethernet or fiber optic interfaces for communicating over a local network, intranet, or the Internet. Wireless interface 118 may facilitate communication over any suitable type of wireless network, such as a wireless LAN, peer-to-peer (P2P), cellular network, and/or wireless personal-area-network (WPAN). In the context of the example environment, wireless interface 118 enables computing device 102 to communicate with cell towers 104-1-104-n.

Wireless interface 118 includes modem 120 and multi-mode transceiver 122 to process data and/or signals associated with communicating data of computing device 102. Modem 120 provides a digital communication interface for data, voice, messaging, and other applications of computing device 102. Modem 120 may include a processor (not shown) to implement signal processing functions to enable wireless communication, such as frequency translation, encoding, decoding, modulation, and/or demodulation. Modem 120 may also include baseband circuitry to perform high-rate sampling processes that can include analog-to-digital conversion, digital-to-analog conversion, gain correction, skew correction, frequency translation, and the like.

Multi-mode transceiver 122 includes circuitry and logic for frequency translation, which may be an up-conversion or down-conversion, performed in a single conversion, or through a plurality of conversion steps. For example, translation from an RF signal to a baseband signal may include a translation to an intermediate frequency (IF). Alternately or additionally, multi-mode transceiver 122 may also include logic to perform in-phase/quadrature (I/Q) operations, such as synthesis, encoding, modulation, decoding, demodulation, and the like.

Modem 120 and multi-mode transceiver 122 can be configured to implement any suitable communication protocol or standard, such as a 3rd Generation Partnership Project (3GPP) protocol, Global System for Mobiles (GSM), Enhanced Data Rates for GSM (EDGE), Code Division Multiple Access (CDMA), CDMA 2000 (1×), Wideband CDMA, Time Division Synchronous CDMA (TD-SCDMA), Evolution-Data Optimized (EVDO), Universal Mobile Telecommunications System (UMTS), Long Term Evolution (LTE), LTE frequency division duplex (LTE-FDD), LTE time division duplex (LTE-TDD), LTE Advanced (LTE-A), Institute of Electrical and Electronics Engineers (IEEE) 802.11 standard, IEEE 802.16 standard and the like. In some aspects, these communication protocols or standards use multiple-input multiple-output (MIMO) or carrier aggregation technology to communicate (e.g., LTE and variants thereof). As such, modem 120 and multi-mode transceiver 122 are configurable for communication via different combinations of communication modes, carriers (e.g., channels), and frequency bands.

To facilitate the communication of signals via these combinations of modes, carriers, and frequencies, wireless interface 118 also includes RF front-end circuitry 124 and antennas 126. RF front-end circuitry 124 routes signals between multi-mode transceiver 122 and antennas 126, which may include any suitable number of antennas. RF front-end circuitry 124 routes signals via switches, multiplexers, amplifiers, and other circuitry via communication paths that correlate to the different combinations of modes, carriers, and frequencies. Some of these components, such as the switches or amplifiers, are implemented as isolated CMOS devices 128, which have linearity and isolation characteristics that are suitable for RF circuits. The implementation and use of isolated CMOS devices varies, and is described below in greater detail.

Figure 2:
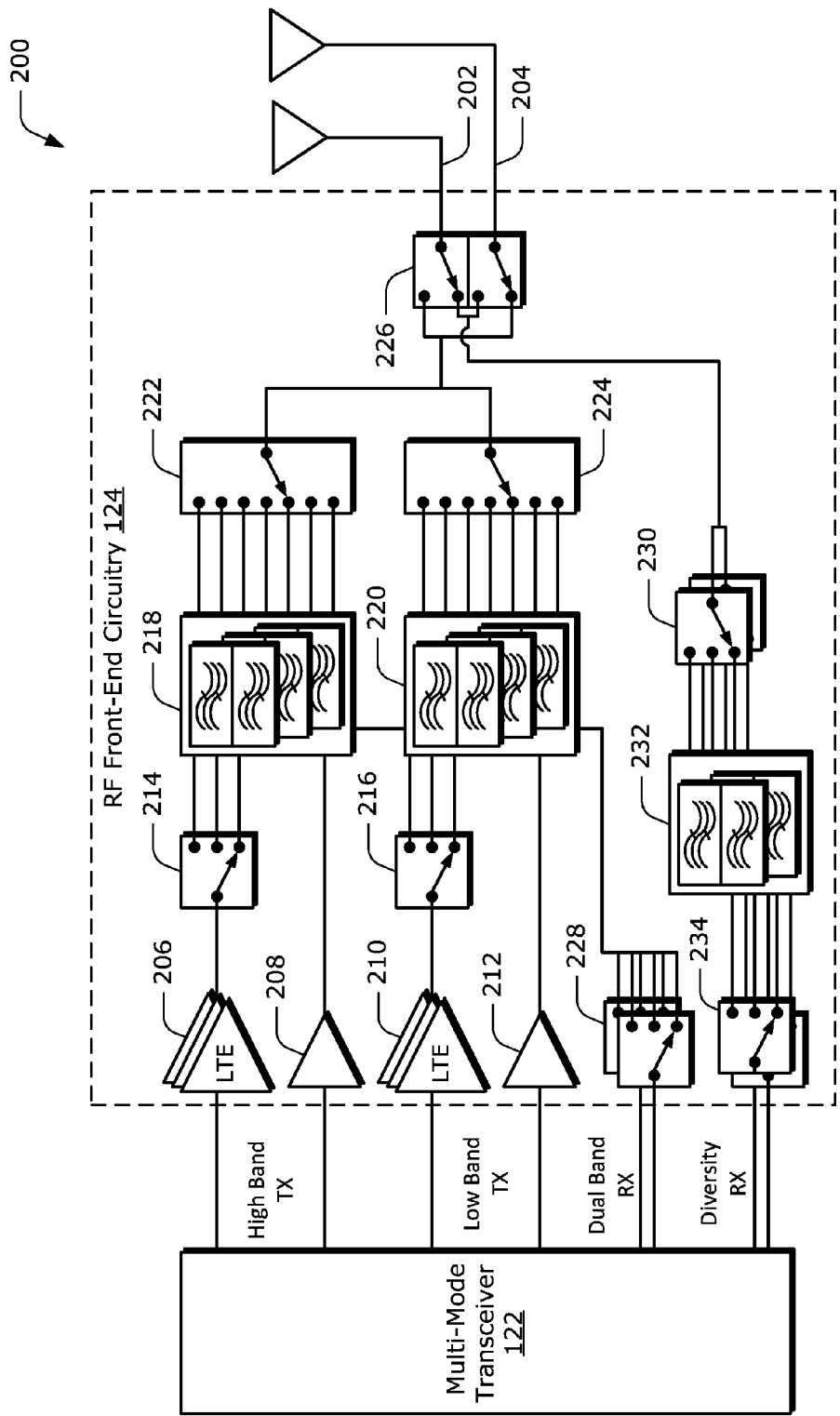
FIG. 2 illustrates an example configuration of a radio-frequency (RF) front-end shown in FIG. 1.

FIG. 2 illustrates an example configuration of RF front-end circuitry 124 generally at 200. In this particular example, multi-mode transceiver 122, RF front-end circuitry 124, and antennas 202 and 204 are configured for multi-mode dual band communication with receive diversity. For example, RF front-end circuitry 124 may route RF signals communicated in accordance with multiple communication protocols or standards, such as CDMA, EVDO, LTE, LTE-A, and the like. In at least some aspects, RF front-end circuitry 124 routes multiple RF signals concurrently to support MIMO, carrier aggregation, or other advanced communication schemes.

RF front-end circuitry 124 includes power amplifiers 206-212 to amplify transmission signals in low and/or high bands. In this particular example, power amplifiers 206 and 210 are configured as broadband amplifiers and power amplifiers 208 and 212 are configured as single-band amplifiers. Amplified signals of power amplifiers 206 and 210 are routed through RF switches 214 and 216, respectively. RF switches 214 and 216 selectively route amplified signals through different filters of filter banks 218 and 220, which include respective bandpass filters for high and low communication bands. Although not shown, a baseband processor or other entity of modem 120 may control the components of multi-mode transceiver 122 and RF front-end circuitry 124 (e.g., switch and amplifier settings) to implement various communication protocols.

RF front-end circuitry 124 also includes RF switches 222 and 224 to route the filtered signals to antenna 202 or antenna 204 via RF switch 226 (e.g., antenna switch). Although illustrated as two (2) antennas, wireless interface 118 may include any suitable number of single or multi-band antennas. Alternately or additionally, antenna 202 or antenna 204 may include tuning circuitry (not shown) to tune the antennas 202, 204 for a particular frequency or improve impedance matching.

For receiving signals, RF front-end circuitry 124 includes RF switches 228, which route the received signals from filter banks 218 and 220 into receive ports (e.g., dual band ports) of multi-mode transceiver 122. RF front-end circuitry 124 also includes RF switches 230 to route other received signals to diversity receive ports of multi-mode transceiver 122. In this particular example, RF switches 230 route the diversity received signals through filter bank 232 for filtering. The filtered diversity signals are then routed to multi-mode transceiver 122 by RF switches 234.

As shown in FIG. 2, the circuitry of RF front-end circuitry 124 may include a complex set of communication paths to facilitate multi-mode multi-frequency communication. Some of these communication paths pass through multiple RF switches, which suffer from non-linearity or poor isolation when implemented using conventional technology (e.g., SOI). This non-linearity and poor isolation of conventional RF switches often results in attenuation and harmonics, reducing device range and interfering with low-power receive signals. In aspects described herein, however, RF components, such as switches and amplifiers, can be implemented with isolated CMOS devices. In many cases, isolated CMOS devices offer better linearity or isolation characteristics than conventionally implemented RF devices (e.g., SOI or buried oxide).

Example RF Component

Figure 3:
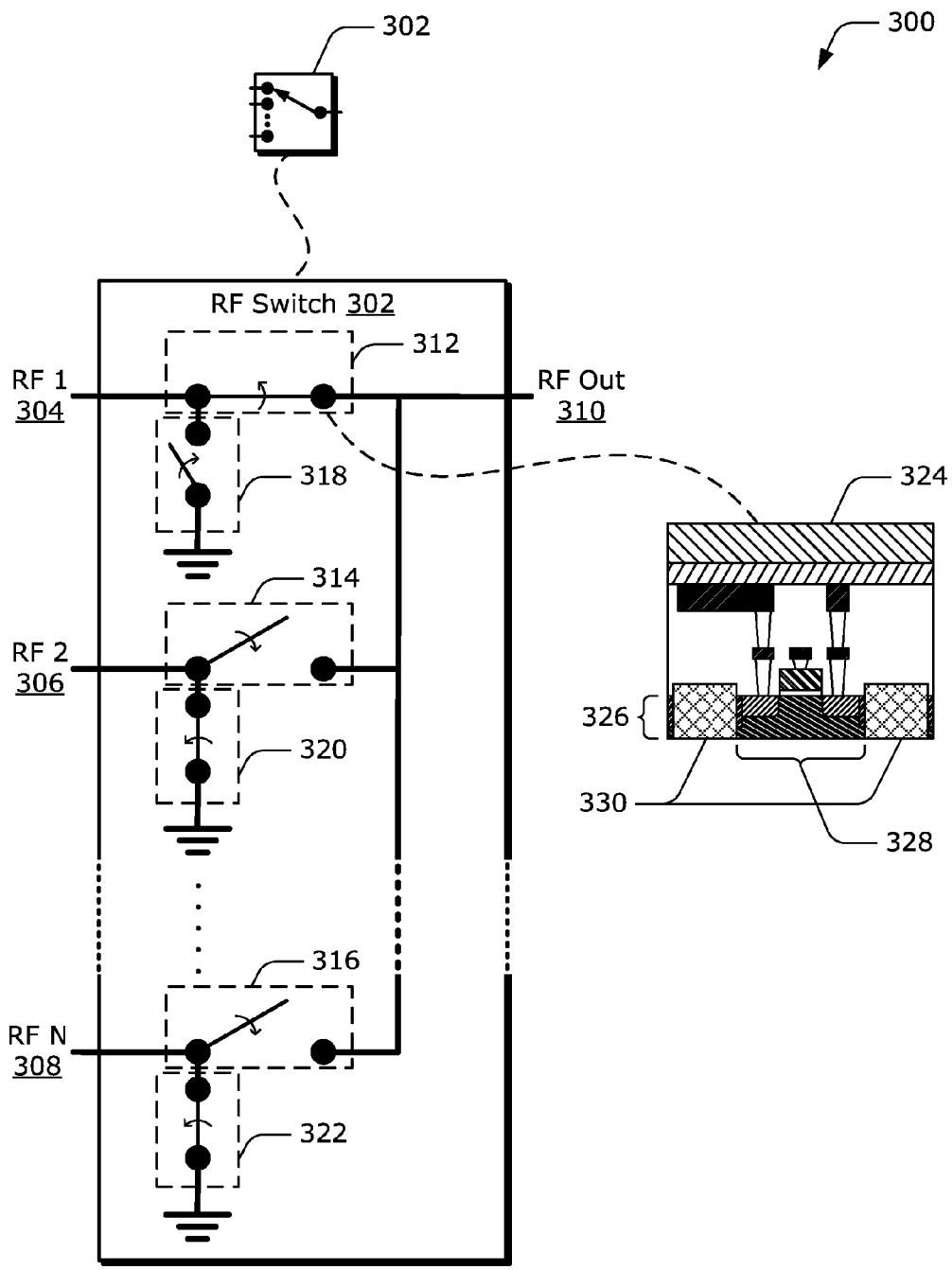
FIG. 3 illustrates an example RF component in accordance with one or more aspects.

FIG. 3 illustrates an example RF component at 300, which is implemented as RF switch 302. RF switch 302 is configured as a single-pole N-throw (SPNT) switch, where N may be any suitable number. As such, RF switch 302 may be also be referred to as a multiplexer or de-multiplexer depending on in-circuit orientation or signal direction. Although shown as a single-pole switch, in other cases RF switch 302 can be configured as a multiple-pole and/or multiple-throw RF switch, such as a double-pole single-throw (DPST), double-pole double-throw (DPDT), and so on.

RF switch 302 includes inputs RF input 1 304 (RF 1 304), RF input 2 306 (RF 2 306), and additional inputs up to and including RF input N 308 (RF N 308), where N is any suitable number. Signals from one of the inputs 304, 306, 308 are routed to RF output 310 (RF out 310) by switch element 312, switch element 314, or switch element 316. Additionally, inputs 304, 306, 308 not being used can be grounded or terminated internally by switch element 318, switch element 320, or switch element 322. In some cases, grounding the non-active inputs 304, 306, 308 is effective to reduce noise or prevent interference with signals of the active input 304, 306, 308.

Any or all of RF switch 302's switching elements can be implemented with isolated CMOS devices. In this particular example, switch element 312 is implemented via isolated CMOS device 324, which is configured to switch RF signals between RF 1 304 and RF out 310 when active. Isolated CMOS device 324 comprises silicon substrate 326 in which source and drain terminals of metal-oxide semiconductor field-effect transistor 328 (isolated MOSFET 328) are embodied. MOSFET 328 is isolated from other devices of silicon substrate 326 by through-silicon trench 330, which is oriented through silicon substrate 326 and around MOSFET 328. In at least some aspects, electrically isolating MOSFET 328 improves signal isolation characteristics of RF switch 302. Although described in reference to an RF switch, isolated CMOS devices can be implemented as any other RF suitable components, such as amplifiers (e.g., power amplifiers), filters, couplers, diplexers, duplexers, tuning circuits, and the like.

Techniques of Isolated CMOS Devices for RF Circuits

The following techniques of isolated CMOS devices for RF circuits may be implemented using any of the previously described entities of the example environment 100 or RF component in FIGS. 1 and 3. Reference to entities, such as isolated CMOS devices 128, RF switch 302, or MOSFET 328, is made by example only and is not intended to limit the ways in which the techniques can be implemented. The techniques are described with reference to example methods illustrated in FIGS. 4 and 8, which are depicted as respective sets of operations or acts that may be performed by entities described herein. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 4:
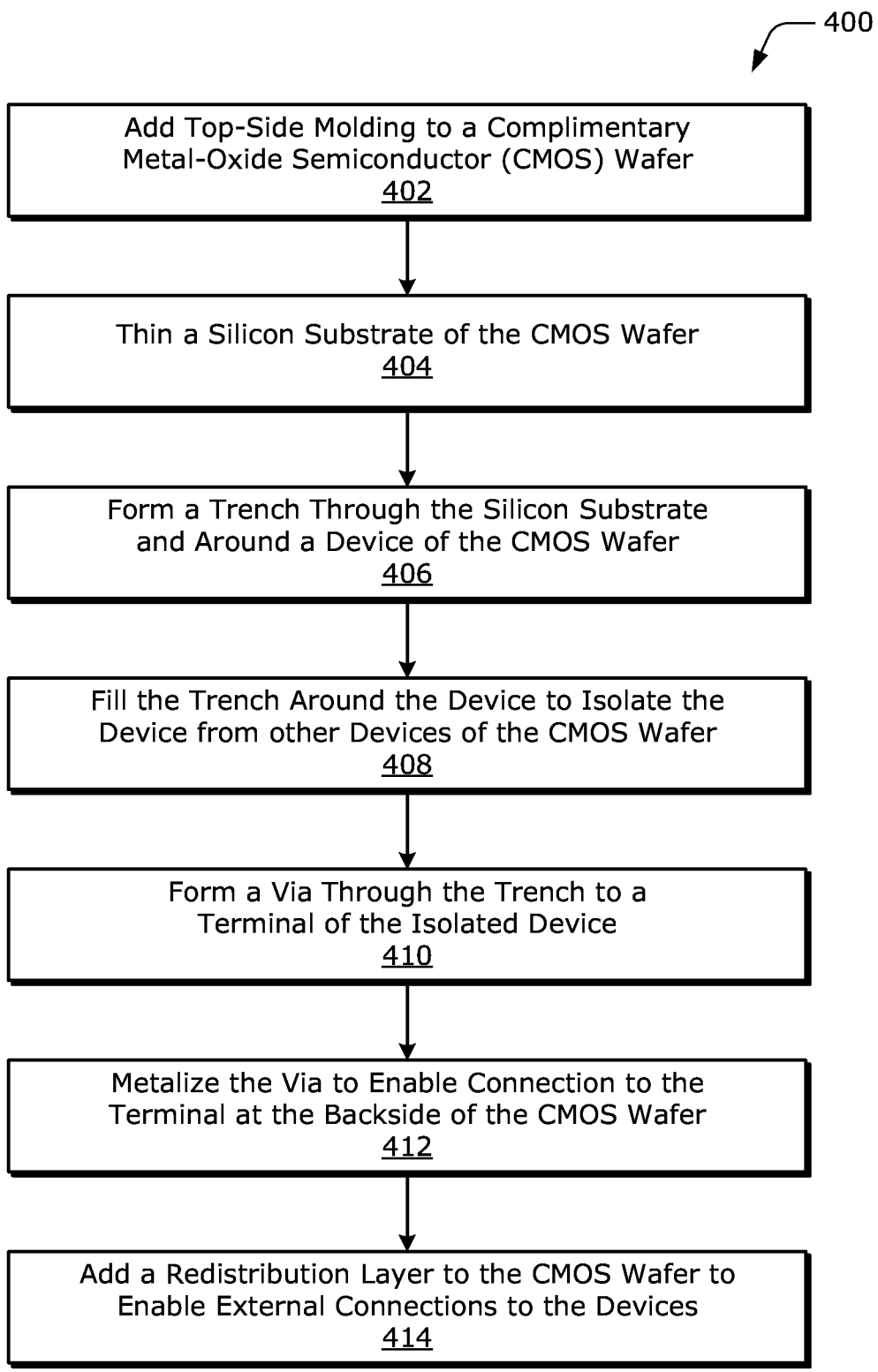
FIG. 4 illustrates an example method for implementing an isolated complementary metal-oxide semiconductor (CMOS) device for RF circuits.

FIG. 4 illustrates an example method 400 for implementing isolated CMOS devices for RF circuits. The operations described herein may be performed using any suitable fabrication or processing machinery, which may provide means for implementing one or more of the operations. In some cases, the operations are performed by an apparatus configured to implement various package or back-end process functions. In such cases, instructions executed by a processor of the apparatus may cause the apparatus to perform the operations.

At block 402, the method 400 includes adding a top-molding layer to a complementary metal-oxide-semiconductor (CMOS) wafer. The top-molding layer may comprise any suitable molding material, such as an epoxy or resin molding compound as examples. The CMOS wafer may be configured as a bulk CMOS wafer produced using conventional front-end-of-line (FEOL) processing. For example, the CMOS wafer can be configured with a P-type silicon substrate in which N-type doped regions form or define terminals of the CMOS wafer's devices, such as MOSFETs.

Figure 5A:
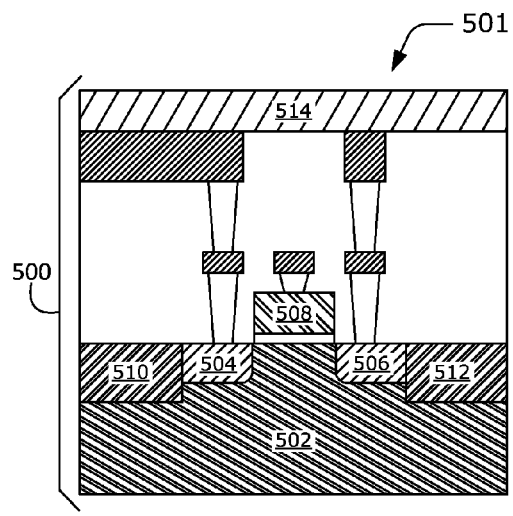
FIGS. 5A-5D illustrate cross-sections of an example CMOS wafer in which an exemplary isolated CMOS device is implemented.

By way of example, consider FIG. 5A in which a cross section of a bulk CMOS wafer 500 to provide CMOS device 501 is illustrated. In this particular example, the bulk CMOS wafer 500 includes P-type silicon substrate 502 (substrate 502) in which N-type doped region 504 and N-type doped region 506 define respective source and drain terminals of a MOSFET. Being a bulk CMOS wafer 500, substrate 502 may be homogeneous substrate of silicon, which is not coupled with nor includes a layer of buried oxide or other type of insulator, insulative substrate layer, or resistive substrate layer. The MOSFET is controlled by gate 508, which can implemented as polysilicon deposited on substrate 502.

In some cases, substrate 502 also includes shallow-trench isolation (STI) region 510 and STI region 512. In other cases, the bulk CMOS wafer 500 does not include STI regions 510 and 512 and substrate 502 occupies the area adjacent to n-type doped regions 504 and 506. The bulk CMOS wafer 500 also includes passivation layer 514, which is above the bulk CMOS wafer 500 and protects underlying connections to the terminals of the MOSFET.

Figure 5B:
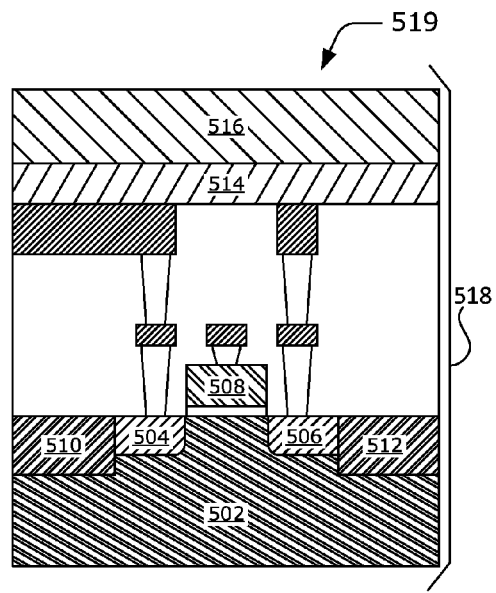

In the context of block 402 in FIG. 4 and FIG. 5B, top-molding layer 516 is added to the bulk CMOS wafer 500 in FIG. 5A to provide bulk CMOS wafer 518 to provide CMOS device 519. Top-molding layer 516 may be added using any suitable process, such as by applying a molding resin or molding epoxy to the bulk CMOS wafer 500 in FIG. 5A. Alternately or additionally, the top-molding layer 516 may be ground or polished to provide a flat surface by which to manipulate the bulk CMOS wafer 500.

Figure 5C:
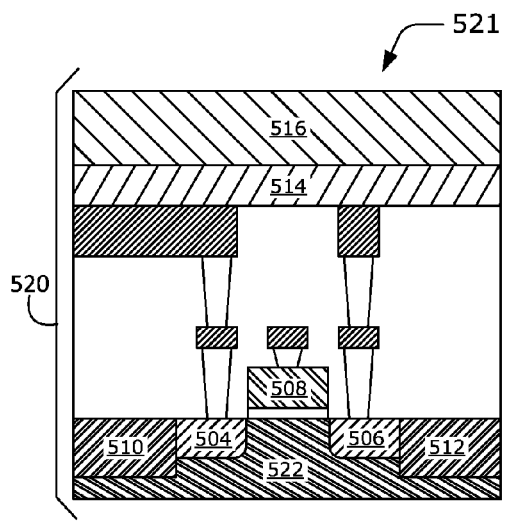

At block 404 in FIG. 4, the method 400 also comprises thinning the substrate 502 of the bulk CMOS wafer 518 in FIG. 5B to provide a thinned silicon substrate 522 in CMOS wafer 520 to provide CMOS device 521 shown in FIG. 5C. The substrate 502 may be thinned by grinding, lapping, or polishing the backside of the bulk CMOS wafer 518 in FIG. 5B. A thickness of the thinned silicon substrate 522 may range from approximately one (1) micrometer (μm) to approximately three (3) μm, as a non-limiting example. Thinning a silicon substrate of a bulk CMOS wafer can be effective to improve active performance of the CMOS device and reduce substrate coupling associated with bulk CMOS devices. In some cases, the CMOS wafer is supported by the top-molding layer during the thinning process. For example, the CMOS wafer may be mechanically captured via the top-molding layer while the backside of the CMOS wafer undergoes a grinding process.

Figure 5D:
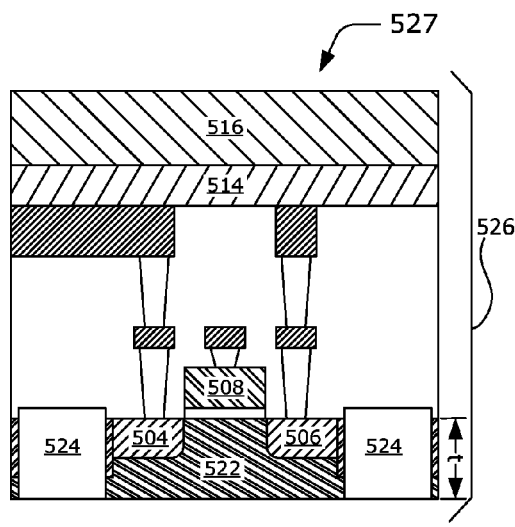

At block 406 in FIG. 4, the method 400 also comprises forming a through-silicon trench 524 through the thinned silicon substrate 522 and around a device of the bulk CMOS wafer 520 in FIG. 5C to provide the CMOS wafer 526 to provide CMOS device 527 in FIG. 5D. The CMOS device 527 of the CMOS wafer 526 may be a MOSFET that is a direct contact device or body contact device that does not have a floating body, as examples. In some cases, the through-silicon trench 524 through the thinned silicon substrate 522 provides means for electrically isolating the CMOS device 527 from other CMOS devices on the CMOS wafer 526. The through-silicon trench 524 is formed completely through the thinned silicon substrate 522 of the CMOS wafer 526 to enable full isolation of the CMOS device 527 provided by the CMOS wafer 526. The through-silicon trench 524 is also formed completely around the CMOS device 527 to form a void between the CMOS device 527 and other devices embodied on the CMOS wafer 526.

In some cases, an aspect ratio of the through-silicon trench 524, which is a height (or depth) 'H' of the through-silicon trench 524 divided by a width 'W' of the through-silicon trench 524, ranges from approximately 0.3 to approximately 1.5 and easily formed using modern trenching processes, as a non-limiting example. For example, a trench through three (3) μm of silicon substrate may be approximately two (2) μm wide. Alternately or additionally, the CMOS wafer 526 and through-silicon trench 524 in FIG. 5D can be configured such that the CMOS device 527 is separated from the other CMOS devices by a distance of approximately three (3) μm to approximately ten (10) μm, as an example.

In the context of the ongoing example, through-silicon trench 524 is formed through thinned silicon substrate 522 as shown in the CMOS wafer 526 in FIG. 5D. Here, note that through-silicon trench 524 is formed completely through thinned silicon substrate 522 and around the CMOS device 527 (e.g., a MOSFET).

At block 408 in FIG. 4, the method 400 also comprises filling the through-silicon trench 524 around the CMOS device 527 in FIG. 5D to isolate the CMOS device 527 from the other devices of the CMOS wafer 526. The through-silicon trench 524 around the CMOS device 527 may be filled with any suitable insulative material, such as polyimide, oxide, polymer, and the like, as non-limiting examples. Continuing the ongoing example, through-silicon trench 524 in the CMOS wafer 526 in FIG. 5D is filled with polyimide 600 as shown in a CMOS wafer 602 providing CMOS device 603 in FIG. 6A.

At block 410 in FIG. 4, the method 400 also comprises forming a via 604 through the through-silicon trench 524 to a terminal 609 of the CMOS device 603 in FIG. 6A to provide a CMOS wafer 606 in FIG. 6B providing CMOS device 607. The via 604 may be formed through the thinned silicon substrate 522 using any suitable type of process, such as by etching the via 604 from the backside of the CMOS wafer 606, as examples. The via 604 may traverse the thinned silicon substrate 522 to make contact to a metalized contact of the terminal 609 located proximate the passivation layer 514 of the CMOS wafer 606. In some cases, a length of the via 604 forms ranges from approximately three (3) μm to approximately five (5) μm, as an example. In the context of the ongoing example, via 604 is formed through through-silicon trench 524 to a contact of the terminal 609 providing the source terminal for the CMOS device 607, as shown in FIG. 6B.

At block 412 in FIG. 4, the method 400 also comprises metallizing the via 604 to enable connection to the terminal 609 of the CMOS device 607 at the backside of the CMOS wafer 606 in FIG. 6B. This metallized via 604 may provide means for connecting the terminal 609 of the CMOS device 607 to circuits coupled to the backside of the CMOS wafer 606, such as a redistribution layer. The metallization may be implemented using any suitable type of metal, such as copper, tungsten, or aluminum. In some cases, a passivation or insulation layer lining the through-silicon trench 524 insulates the metallized via 604 from the thinned silicon substrate 522 of the CMOS device 607 and wafer 606.

At block 414 in FIG. 4, the method 400 also comprises adding a redistribution layer to the backside of the CMOS wafer 606 to enable external connections to devices of the CMOS wafer 606. In some cases, metal circuits or interconnects of the redistribution layer are coupled to the backside of the CMOS wafer 606 via a layer of dielectric material. In such cases, this dielectric material may include any suitable type of dielectric, such as polyimide or Bisbenzocyclotene (BCB). This layer of dielectric may also provide means for coupling the redistribution layer to the backside of the CMOS wafer 606. The redistribution layer may connect the CMOS device 607 to other devices of the CMOS wafer 606 or to external contacts. For example, the redistribution layer may connect terminals of the CMOS device 607 to solder balls or pads mounted to an external surface of the redistribution layer.

Concluding the present example, via 604 of the CMOS device 607 in FIG. 6B is metallized to form metallized via 610 in a CMOS wafer 612 to form CMOS device 613, as shown in FIG. 6C. Redistribution layer 614 is added to thinned silicon substrate 522 in the CMOS wafer 612. Metallized via 610 is formed such that the terminal 609 of the CMOS device 613 is connected through redistribution layer 614 to one of a solder ball 616 of solder ball array 618. After adding redistribution layer 614 and solder ball array 618, the CMOS wafer 612 in FIG. 6C may undergo other back-end or packaging operations if desired.

Figure 7:
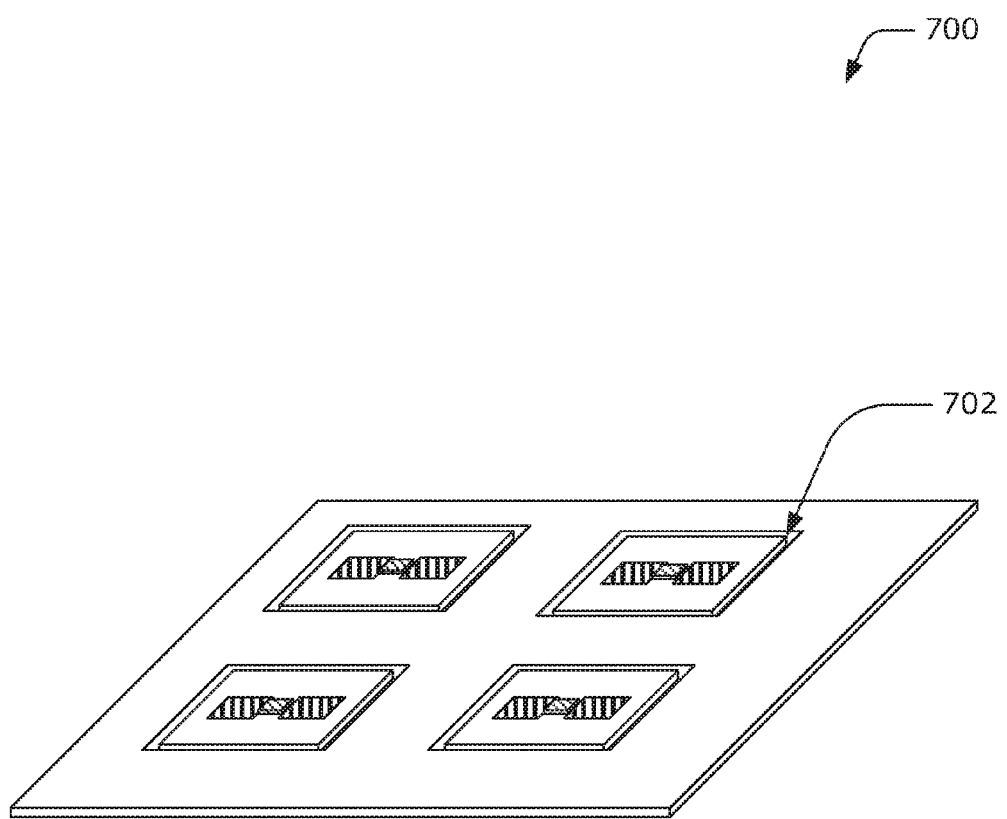
FIG. 7 illustrates a planar view of isolated CMOS devices in accordance with one or more aspects.

In some aspects, operations of method 400 are implemented to isolate multiple devices of a CMOS wafer. By way of example, consider FIG. 7, which illustrates an array 700 of individual CMOS devices that are isolated from other devices of a CMOS wafer. Here, note that a trench 702 forms a continuous channel around doped regions of each CMOS device and electrically isolates each of the isolated CMOS devices from the other devices on the wafer.

Isolating the CMOS devices can protect isolated RF circuits from over-voltage or inadvertent activation. For example, when an antenna is blocked or detuned, the resulting impedance mismatch can reflect transmission signals back into RF front-end circuitry 124. Instead of being low-voltage high-current signals as transmitted, the reflected signals are often low-current high-voltage signals. Normally, the high voltage level of the reflected signals (e.g., 25 V) is sufficient to cause inadvertent activation of devices of the CMOS wafer. With isolated CMOS devices, however, the high voltage level can be spread or dissipated across multiple isolated CMOS devices such that each of the isolated CMOS devices is exposed to a reflected signal of much lower voltage (e.g., 2.5 V). In such cases, the lower voltage is often insufficient to activate the isolated CMOS devices.

Figure 8:
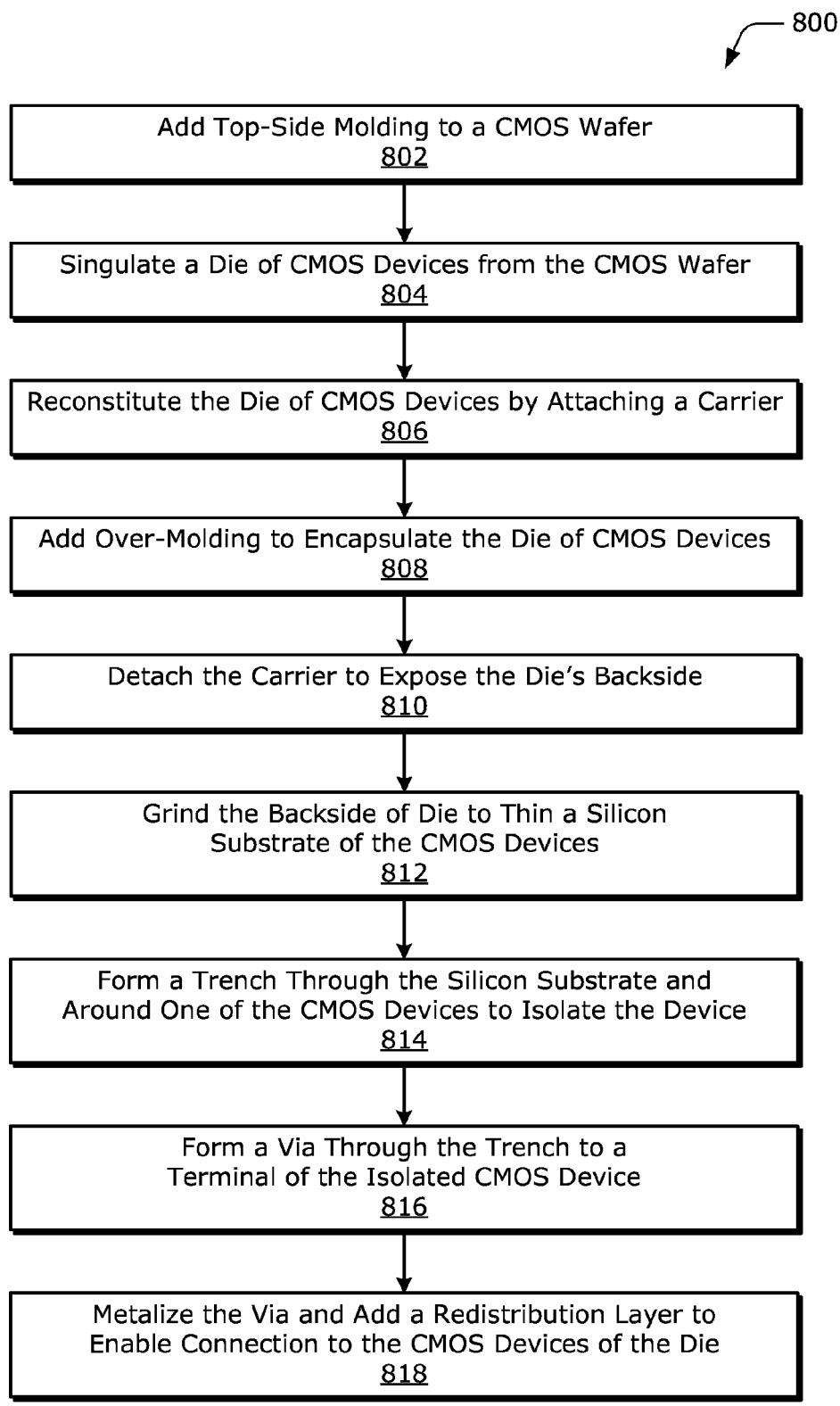
FIG. 8 illustrates another example method for implementing an isolated CMOS device for RF circuits.

FIG. 8 illustrates another example method 800 for implementing isolated CMOS devices for RF circuits. In some cases, the operations are performed by an apparatus configured to implement various package or back-end process functions. In such cases, instructions executed by a processor of the apparatus may cause the apparatus to perform the operations.

At block 802, the method 800 includes adding a top-molding layer to a CMOS wafer. The top-molding layer may comprise any suitable molding material, such as an epoxy or resin molding compound. The CMOS wafer may be configured as a bulk CMOS wafer produced using conventional front-end-of-line (FEOL) processing.

By way of example, FIG. 9A is cross section views of a CMOS wafer 900. In this particular example, the CMOS wafer 900 includes a silicon substrate 902 in which region 904 and region 906 define respective source terminal 907 and drain terminal 909 of a CMOS device 911. Additionally, silicon substrate 902 is not heterogeneous and does not include a layer of buried oxide or other type of insulator. Polysilicon 908 is configured as a gate to control current flow through the CMOS device 911 and is separated from silicon substrate 902 by an insulator 913.

Silicon substrate 902 may also include STI region 910 and STI region 912 to facilitate trenching operations. When the CMOS wafer 900 does not include STI regions 910 and 912, silicon substrate 902 may occupy the area adjacent to regions 904 and 906. The CMOS wafer 900 also includes a passivation layer 914, which is located above the CMOS wafer 900 and protects underlying connections to the source and drain terminals 907, 909 of the CMOS device 911. As shown in FIG. 9B, a top-molding layer 916 is added to the CMOS wafer 900 in FIG. 9A to provide a CMOS wafer 918 in FIG. 9B to provide CMOS device 919.

At block 804 in FIG. 8, the method 800 comprises singulating a die of CMOS devices from the CMOS wafer. A portion of the CMOS wafer may be diced or cut to provide the die using any suitable process, such as by cutting the wafer with a saw, blade, etching, and the like. Continuing the ongoing example, a die of CMOS devices 919 is singulated from the CMOS wafer 918 in FIG. 9B to provide a die 920 of the CMOS wafer 918 that includes CMOS device 921, as shown in FIG. 9C.

At block 806 in FIG. 8, the method 800 further comprises reconstituting the CMOS wafer 918 by attaching a carrier 922 to a backside of the CMOS wafer 918, as shown in FIG. 9D. The carrier 922 may be formed from any suitable type of material, such as glass or ceramic. In some cases, the carrier 922 is attached to the die 920 of the CMOS device 921 via an adhesive tape or foil. In the context of the present example, carrier 922 is added to the die 920 of CMOS device 921 in FIG. 9C, as shown in FIG. 9D.

Figures 10A, 10B:
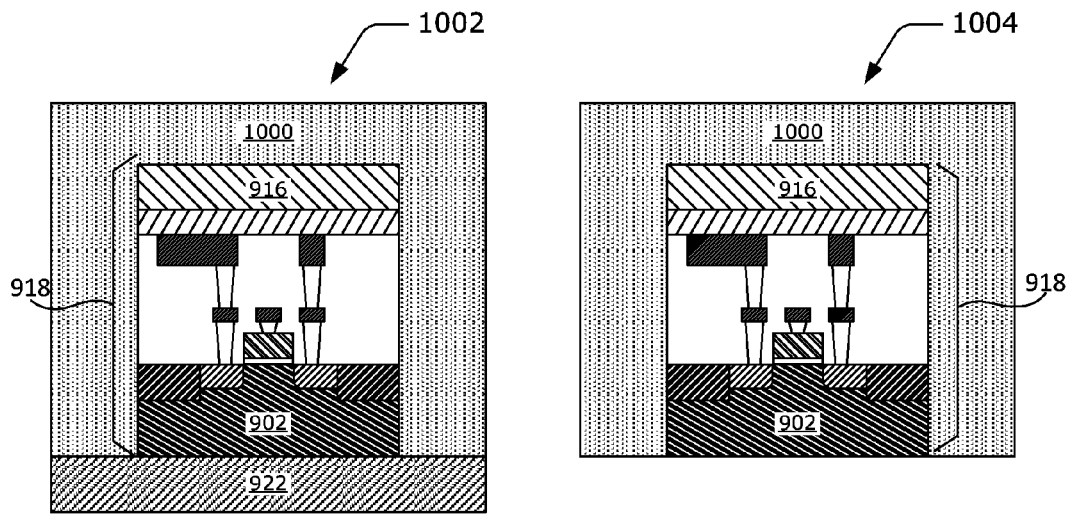
FIGS. 10A-10D illustrate additional cross-sections of the CMOS wafer in FIGS. 9A-9D in which the isolated CMOS device is implemented.

At block 808 in FIG. 8, the method 800 further comprises adding over-molding 1000 to the CMOS wafer 918 to encapsulate the die 920 of CMOS device 921 in FIG. 9D to provide a CMOS device 1002 in FIG. 10A. The over-molding 1000 may comprise any suitable molding material applied to the die 920, such as an epoxy or resin molding compound. In some cases, the carrier 922 attached to the backside of the CMOS wafer 918 protects the die 920 from the over-molding 1000 material. Continuing the ongoing example, over-molding 1000, which may be over-molding, is added to the CMOS wafer 918 of CMOS device 921 to encapsulate the CMOS wafer 918, as shown in FIG. 10A.

At block 810 in FIG. 8, the method 800 further comprises detaching the carrier 922 from the CMOS wafer 918 in FIG. 10A to expose the CMOS wafer's 918 backside to form CMOS device 1004. The carrier 922 can be detached from the backside of the CMOS wafer 918 by heating or dissolving an adhesive that bonds the carrier 922 to the CMOS wafer 918, as an example, to form CMOS device 1004. In the context of the present example, carrier 922 is removed from the CMOS wafer 918 of the CMOS device 1004 to expose the backside of the CMOS wafer 918, particularly silicon substrate 902.

At block 812 in FIG. 8, the method 800 comprises grinding the backside of the CMOS wafer 918 in FIG. 10B to thin the silicon substrate 902 of the CMOS device 1004 to form a CMOS wafer 1006 for CMOS device 1007. The silicon substrate 902 may be ground to a thickness that ranges from approximately two (2) µm to approximately three (3) µm. Thinning the silicon substrate 902 can be effective to improve active performance of the CMOS device 1004 in FIG. 10B and reduce substrate coupling associated with bulk CMOS devices. In some cases, the CMOS wafer 918 in FIG. 10B is supported by the over-molding 1000 during the grinding process to provide CMOS wafer 1006. For example, the CMOS wafer 918 in FIG. 10B may be mechanically captured via the over-molding 1000 while the backside of the CMOS wafer 918 is ground to provide CMOS wafer 1006 in FIG. 10C. Continuing the ongoing example, silicon substrate 902 is ground to a particular thickness, such as approximately two (2) µm as shown in the CMOS wafer 1006 in FIG. 10C. Note, that in this example, over-molding 1000 is also ground to approximately flush with silicon substrate 902.

Figures 10C, 10D:
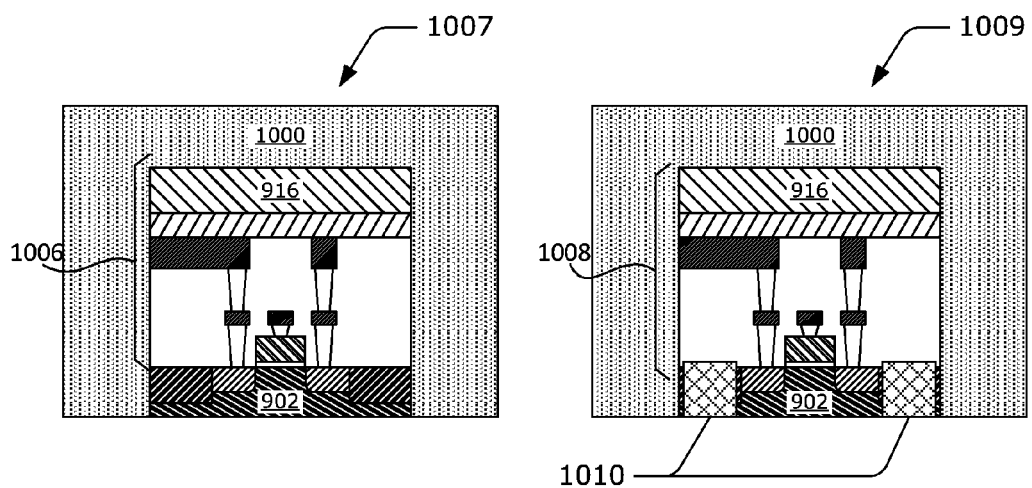

At block 814 in FIG. 8, the method 800 further comprises forming a trench 1010 through the silicon substrate 902 and around one of the CMOS devices 1007 in FIG. 10C to form CMOS wafer 1008 providing CMOS device 1009, as shown in FIG. 10D. The trench 1010 isolates the CMOS device 1009 from other CMOS devices of the CMOS wafer 1008. The trench 1010 is formed completely through the silicon substrate 902 of the CMOS wafer 1008 in this example to fully isolate the CMOS device 1009. The trench 1010 is also formed completely around the CMOS device 1009 to separate the CMOS device 1009 and other devices embodied on the CMOS wafer 1008. In the context of the ongoing example, trench 1010 is formed through silicon substrate 902 in FIG. 10D and filled with an insulator. Here, note that trench 1010 is formed completely through silicon substrate 902 and around the CMOS device 1009.

Figure 11A:
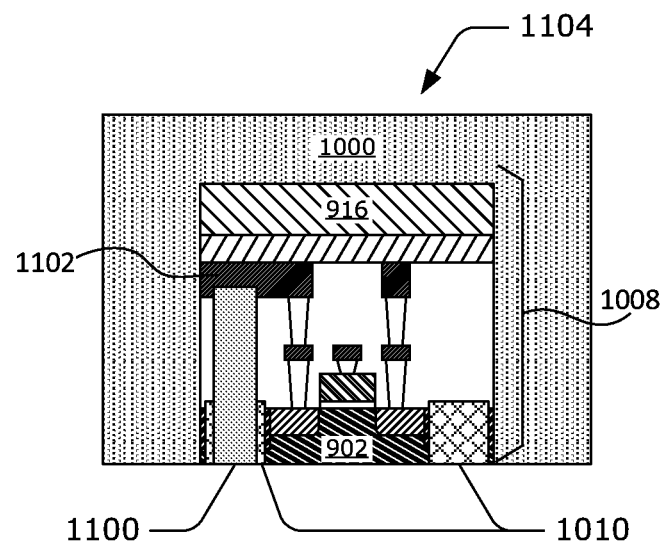
FIGS. 11A-11B illustrate cross-sections of the CMOS wafer in FIGS. 9A-9D with packaging and electrical interconnects.

At block 816 in FIG. 8, the method 800 further comprises forming a via 1100 through the trench 1010 to a terminal 1102 of the isolated CMOS device 1009 in FIG. 10D to form a CMOS device 1104 in the CMOS wafer 1008, as shown in FIG. 11A. The via 1100 may be formed through the silicon substrate 902 using any suitable type of process, such as by etching the via 1100 from the backside of the CMOS wafer 1008. The via 1100 is metallized to connect a contact of the terminal 1102 to the backside of the CMOS wafer 1008. In some cases, a length of the via 1100 forms ranges from approximately three (3) µm to approximately five (5) µm. In the context of the ongoing example, via 1100 is formed through the trench 1010 as shown in FIG. 11A to enable connection of the terminal 1102 at the backside of the CMOS wafer 1008.

Figure 11B:
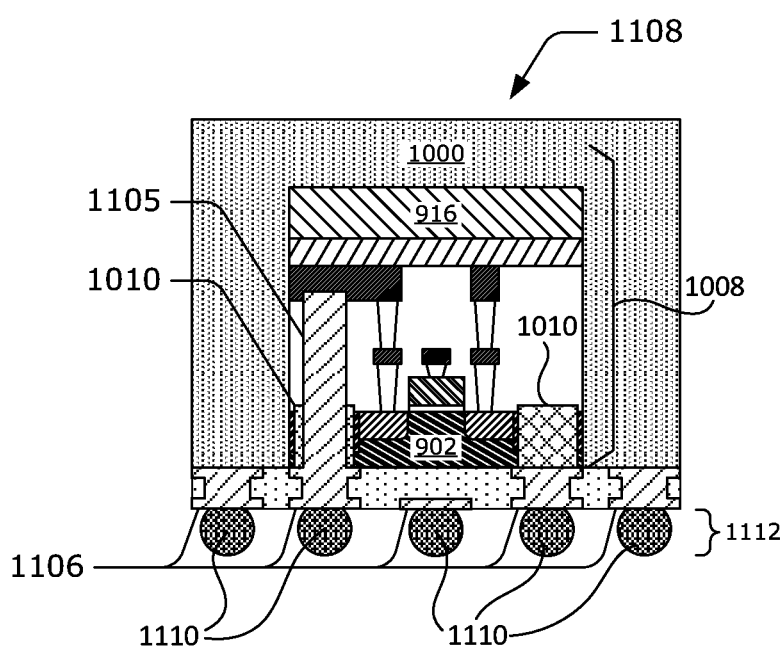

At block 818 in FIG. 8, the method 800 comprises metallizing the via 1100 to form a metalized via 1105 and adding a redistribution layer 1106 to the CMOS device 1102 in FIG. 11A to form a CMOS device 1108 in FIG. 11B to enable connection to the CMOS device 1108 of the CMOS wafer 1008. The metallization of the via 1100 to form metalized via 1105 may be implemented using any suitable type of metal, such as copper, tungsten, or aluminum. In some cases, a passivation or insulation layer lining the trench 1010 isolates the metallized via 1105 from the silicon substrate 902 of the CMOS device 1108 and the CMOS wafer 1008.

The redistribution layer 1106 connects the CMOS device 1108 to other devices of the CMOS wafer 1008 or to external contacts, such as solder balls 1110 or solder pads on an exterior surface of the redistribution layer 1106. Concluding the present example, metallized via 1105 is formed and redistribution layer 1106 is coupled to silicon substrate 902 in the CMOS device 1108, as shown in FIG. 11B. In some cases, redistribution layer 1106 is coupled directly to silicon substrate 902 via a layer of dielectric and does not include an interposed layer of insulator, trap-rich silicon, or oxide. A solder ball array 1112 comprised of one or more solder balls 1110 is added to an exterior surface of redistribution layer 1106 to enable mechanical and electrical connection of the CMOS wafer 1008.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A radio-frequency (RF) circuit, comprising:
   a plurality of complementary metal-oxide semiconductor (CMOS) devices;
   a silicon substrate having doped regions that define the plurality of CMOS devices;
   a trench through the silicon substrate that forms a continuous channel around the doped regions of a CMOS device among the plurality of CMOS devices to electrically isolate the CMOS device from at least one other CMOS device among the plurality of CMOS devices embodied on the silicon substrate;
   a redistribution layer coupled to the silicon substrate; and
   a via oriented along the trench that electrically connects one terminal of a plurality of terminals of the CMOS device to the redistribution layer.

2. The RF circuit of claim 1, wherein the redistribution layer is coupled to the silicon substrate via a layer of dielectric and without an interposed layer of buried oxide or trap-rich silicon.

3. The RF circuit of claim 2, wherein a length of the via includes a range of approximately three (3) micrometers to approximately five (5) micrometers.

4. The RF circuit of claim 1, wherein a thickness of the silicon substrate includes a range of approximately one (1) micrometer to approximately three (3) micrometers.

5. The RF circuit of claim 1, wherein the CMOS device comprises a direct contact device or body contact device that does not have a floating body.

6. The RF circuit of claim 1, wherein the trench comprises a first trench, the CMOS device comprises a first CMOS device, the continuous channel comprises a first continuous channel, and further comprising:
   a second trench through the silicon substrate that forms a second continuous channel around the doped regions of a second CMOS device to electrically isolate the second CMOS device from the first CMOS device and the at least one other CMOS device on the silicon substrate.

7. The RF circuit of claim 1, wherein a width of the CMOS device across the silicon substrate is approximately twenty (20) micrometers to approximately forty (40) micrometers.

8. The RF circuit of claim 1, wherein an aspect ratio of a height of the trench divided by a width of the trench includes a range of approximately 0.3 to approximately 1.5.

9. The RF circuit of claim 1, wherein the continuous channel around the doped regions of the CMOS device is filled with an insulator.

10. The RF circuit of claim 1, wherein the continuous channel around the doped regions of the CMOS device completely separates the silicon substrate of the CMOS device from portions of the silicon substrate supporting the at least one other CMOS device.

11. The RF circuit of claim 1, wherein the silicon substrate is homogeneous and not coupled with an insulative substrate layer or a resistive substrate layer.

12. The RF circuit of claim 1, wherein a structure of the RF circuit is covered with a passivation layer and a top-molding layer, the passivation layer configured to support the top-molding layer.

13. The RF circuit of claim 1, wherein the CMOS device is configured in whole or in part as an RF switch or RF power amplifier.

14. The RF circuit of claim 1, wherein the RF circuit is implemented within a device configured as a modem, cellular base station, broadband router, access point, cellular phone, smart-phone, gaming device, navigation device, media device, laptop computer, desktop computer, server, network-attached storage (NAS) device, smart appliance, or vehicle-based communication system.

15. A radio-frequency (RF) circuit, comprising:
    a silicon substrate;
    a plurality of complementary metal-oxide semiconductor (CMOS) devices embodied on the silicon substrate;
    means for electrically isolating a portion of the silicon substrate on which a CMOS device among the plurality of CMOS devices is electrically isolated from another portion of the silicon substrate on which at least one other CMOS device among the plurality of CMOS devices is embodied;
    means for coupling a redistribution layer to the silicon substrate; and
    means for electrically connecting, oriented along the means for electrically isolating the portion of the silicon substrate, a terminal of a plurality of terminals of the CMOS device to the redistribution layer.

16. The RF circuit of claim 15, wherein the means for coupling the redistribution layer to the silicon substrate comprises a layer of dielectric.

17. A radio-frequency (RF) semiconductor component, comprising:
    a plurality of complementary metal-oxide semiconductor (CMOS) devices embodied on a silicon substrate, at least one CMOS device among the plurality of CMOS devices embodied on a portion of the silicon substrate that is separated from a remaining portion of the silicon substrate by a trench through the silicon substrate and around the at least one CMOS device;
    a redistribution layer coupled to the silicon substrate that enables connectivity to the plurality of CMOS devices;
    a via oriented along the trench that electrically connects one terminal of a plurality of terminals of the at least one CMOS device to the redistribution layer; and
    an overmolding that encapsulates the plurality of CMOS devices and supports the redistribution layer.

18. The RF semiconductor component of claim 17, wherein the RF semiconductor component is configured as a switch or an amplifier.

* * * * *